(12) United States Patent
Enzelberger-Heim et al.

(10) Patent No.: US 11,869,725 B2
(45) Date of Patent: Jan. 9, 2024

(54) MULTI-STACKED CAPACITOR

(71) Applicant: Texas Instruments Incorporated, Dallas, TX (US)

(72) Inventors: Michael Hans Enzelberger-Heim, Munich (DE); Jonas Höhenberger, Kissing (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/537,626

(22) Filed: Nov. 30, 2021

(65) Prior Publication Data

US 2023/0170153 A1    Jun. 1, 2023

(51) Int. Cl.
  *H01G 4/40*    (2006.01)
  *H01G 4/008*   (2006.01)
  *H01G 4/30*    (2006.01)

(52) U.S. Cl.
  CPC ............. *H01G 4/40* (2013.01); *H01G 4/008* (2013.01); *H01G 4/30* (2013.01)

(58) Field of Classification Search
  None
  See application file for complete search history.

(56) References Cited

U.S. PATENT DOCUMENTS

| | | | | |
|---|---|---|---|---|
| 5,125,138 A * | 6/1992 | Shaw | | H01G 4/306 29/25.42 |
| 5,745,335 A * | 4/1998 | Watt | | H01L 28/60 361/308.1 |
| 6,411,494 B1 * | 6/2002 | Watt | | H01L 23/49822 361/306.3 |
| 6,747,334 B2 * | 6/2004 | Kitagawa | | H01L 28/56 257/532 |
| 6,853,051 B2 * | 2/2005 | Shioga | | H01L 28/40 257/E23.079 |
| 7,298,050 B2 * | 11/2007 | Kurihara | | H01L 23/481 438/668 |
| 9,096,426 B2 * | 8/2015 | Smith | | H10N 30/501 |
| 9,552,924 B2 * | 1/2017 | Kamath | | H01G 4/005 |
| 10,153,092 B2 * | 12/2018 | Kumagae | | H01L 28/56 |
| 2003/0136997 A1 * | 7/2003 | Shioga | | H01L 27/016 257/E23.079 |
| 2005/0287755 A1 * | 12/2005 | Bachmann | | H01L 27/0805 257/E27.048 |

(Continued)

FOREIGN PATENT DOCUMENTS

| | | |
|---|---|---|
| CN | 106340544 A | 1/2017 |
| DE | 102018107387 A1 | 3/2019 |
| GB | 2371408 A | 7/2002 |

OTHER PUBLICATIONS

DE Office Action dated Sep. 13, 2023.

*Primary Examiner* — Dion R. Ferguson
(74) *Attorney, Agent, or Firm* — Andrew R. Ralston; Frank D. Cimino

(57) ABSTRACT

A stacked capacitor includes a capacitor stack. The capacitor stack includes a base plate having a first surface and a second opposing surface, a first dielectric layer on or over the base plate, and a first conductive plate on or over the first dielectric layer. A second dielectric layer is on or over the first conductive plate. A second conductive plate on or over the second dielectric layer. The capacitor stack has at least one sloped side with at least one slope with respect to the second surface of the base plate.

20 Claims, 17 Drawing Sheets

(56) References Cited

U.S. PATENT DOCUMENTS

| | | | | |
|---|---|---|---|---|
| 2008/0145996 A1* | 6/2008 | Nomura | ................... | H01G 4/33 |
| | | | | 257/E21.011 |
| 2009/0104540 A1 | 4/2009 | Burgess et al. | | |
| 2010/0044831 A1* | 2/2010 | Guegan | ................... | H01L 28/60 |
| | | | | 257/532 |
| 2010/0252527 A1* | 10/2010 | Takeshima | .............. | H01L 28/91 |
| | | | | 216/13 |
| 2013/0048596 A1* | 2/2013 | Komuro | ................... | H01G 4/30 |
| | | | | 216/6 |
| 2014/0299967 A1* | 10/2014 | Smith | ................. | H10N 30/082 |
| | | | | 257/618 |
| 2015/0357401 A1* | 12/2015 | Pelloquin | ............... | H01L 28/60 |
| | | | | 257/532 |
| 2017/0345576 A1* | 11/2017 | Tsuyoshi | ............... | H01G 4/012 |
| 2018/0102219 A1* | 4/2018 | Kumagae | ............... | H01G 4/012 |
| 2022/0320265 A1* | 10/2022 | Huang | .................... | H01G 4/40 |

\* cited by examiner

US 11,869,725 B2

MULTI-STACKED CAPACITOR

TECHNICAL FIELD

This application is in the field of semiconductor devices having stacked capacitors and methods of forming stacked capacitors.

BACKGROUND

Capacitors have a broad range of applications, such as uses in integrated circuits in combination with other components. Capacitors that are to implement large capacitances occupy large areas on a die. This increases the die area and/or may require each die to be larger thereby reducing the number of dies that can be fabricated from a single wafer.

SUMMARY

Various disclosed methods and stacked capacitors may be beneficially applied to dies or chips where increased capacitance is required in a limited area. While such embodiments may be expected to provide improvements in performance, such as increased capacitance and/or reduced area consumption, no particular result is a requirement of the present invention unless explicitly recited in a particular claim.

In one aspect of the present disclosure, a stacked capacitor includes a capacitor stack. The capacitor stack includes a base plate having a first surface and a second opposing surface, a first dielectric layer on or over the base plate, and a first conductive plate on or over the first dielectric layer. A second dielectric layer is on or over the first conductive plate. A second conductive plate on or over the second dielectric layer. The capacitor stack has at least one sloped side with at least one slope with respect to the second surface of the base plate.

In another aspect of the present disclosure, an integrated circuit has a stacked capacitor. The stacked capacitor includes a capacitor stack. The capacitor stack has at least two dielectric layers, at least three conductive plates that include a base plate and first and second conductive plates, and at least one sloped side. The base plate has a first surface and a second opposing surface. The at least one sloped side of the capacitor stack has at least one slope with respect to the second surface of the base plate. The at least one sloped side of the capacitor stack includes sloped sides of the at least two dielectric layers and sloped sides of the first and second conductive plates of the at least three conductive plates. The stacked capacitor further includes a first electrode pad and a second electrode pad. The at least three conductive plates include a first group of conductive plates conductively coupled to the first electrode pad, and a second group of conductive plates conductively coupled to the second electrode pad.

In another aspect of the present disclosure, a method of forming a stacked capacitor includes forming a capacitor stack by deposition. The capacitor stack includes at least two dielectric layers and at least three conductive plates including a base plate, and the base plate has a first surface and a second opposing surface. A photoresist film is coated on or over the capacitor stack. The photoresist film is patterned into a patterned photoresist mask having at least one sloped side with respect to the second surface of the base plate, by introducing light, through a gray-scale mask, to the photoresist film. At least one sloped contact side of the capacitor stack and with respect to the second surface of the base plate is formed by using etching and the same patterned photoresist mask.

BRIEF DESCRIPTION OF THE DRAWINGS

For a detailed description of various examples, reference will now be made to the accompanying drawings in which.

DETAILED DESCRIPTION

Capacitors have high area consumption in order to generate high capacities or capacitances. This increases the die area and reduces the die output per wafer.

The present disclosure is directed to a stacked capacitor with increased capacitance and/or reduced area consumption, and a method of forming the stacked capacitor. Such stacked capacitor may be beneficially employed in dies for increased capacity and/or reduced area consumption. While such embodiments may be expected to provide improvements relative to conventional capacitor, no particular result is a requirement of the present invention unless explicitly recited in a particular claim.

The described examples include a stacked capacitor that includes a capacitor stack. The capacitor stack includes a base plate having a first surface and a second opposing surface, a first dielectric layer on or over the base plate, a first conductive plate on or over the first dielectric layer, a second dielectric layer on or over the first conductive plate, and a second conductive plate on or over the second dielectric layer. The capacitor stack has at least one sloped side with at least one slope with respect to the second surface of the base plate. The at least one sloped contact side is achieved with a single patterned etch and yet allows multiple plates of the capacitor stack to be conductively coupled to respective vias. Accordingly, the capacitance (or capacity) of the capacitor can be increased without increasing lateral die area occupied by the capacitor and without introducing extra mask layers.

Figure 1:
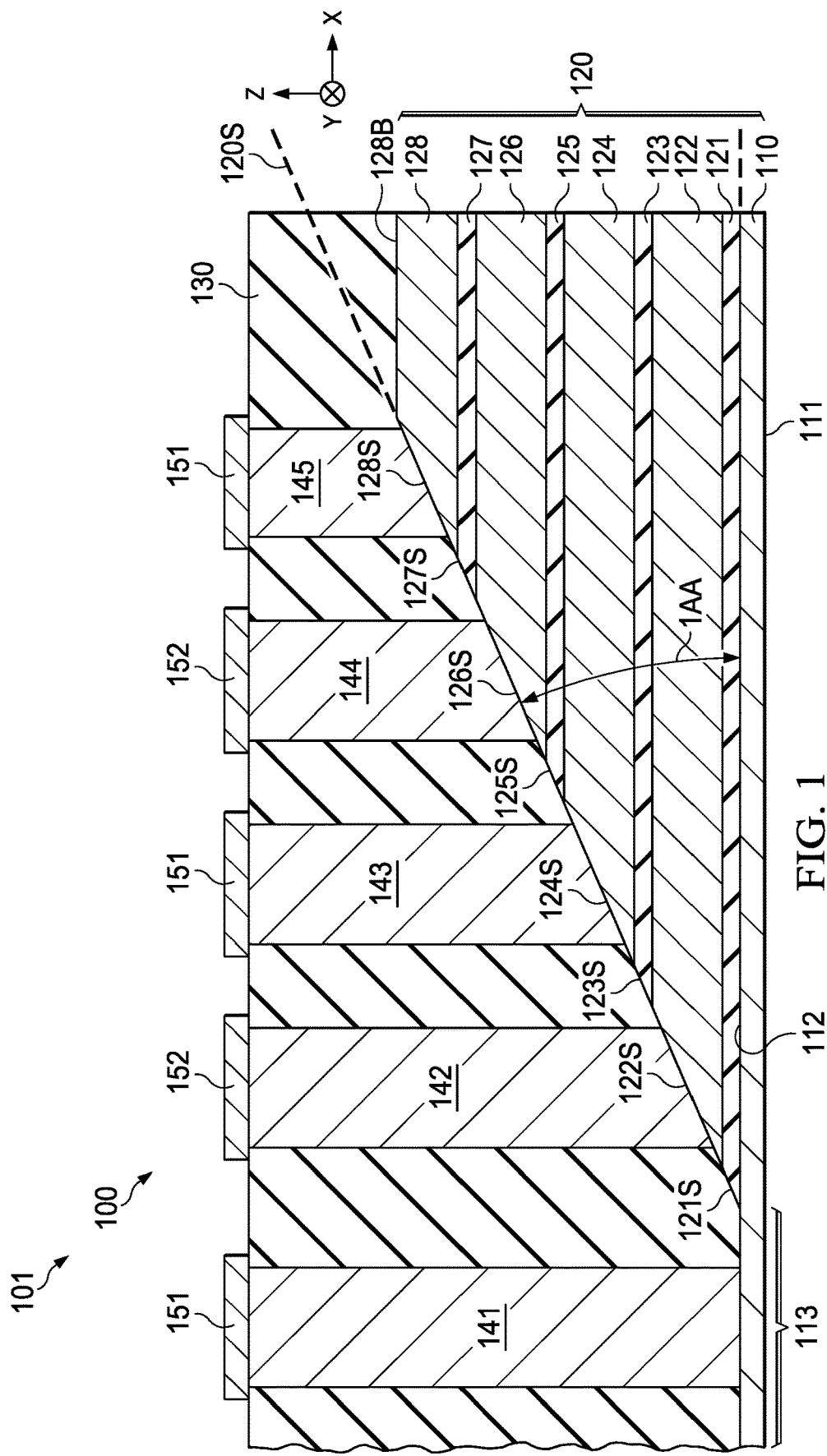
FIG. 1 illustrates a cross-sectional view of an example multi-stacked capacitor.
Figure 2:
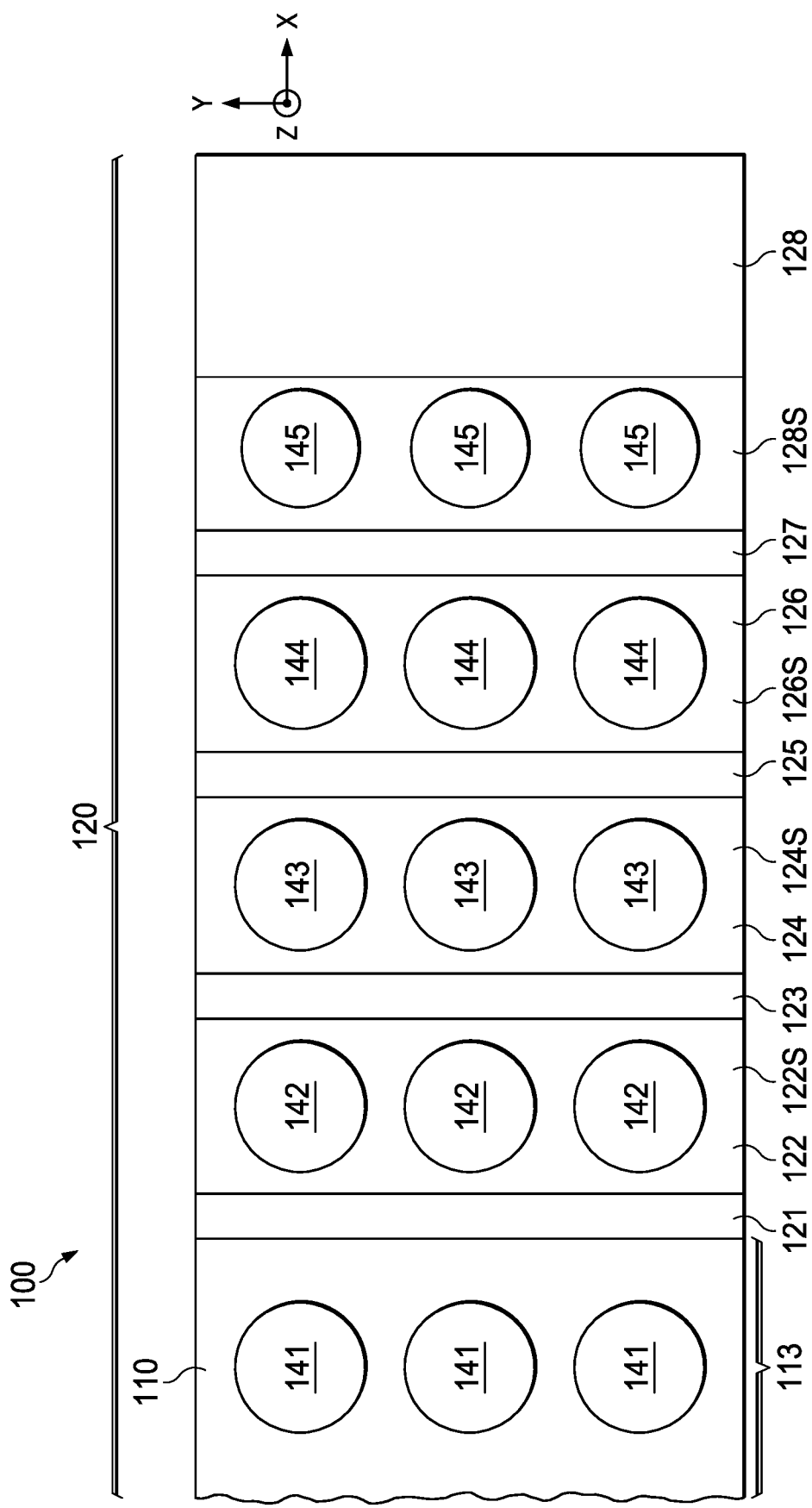
FIG. 2 illustrates a plan view of components of the example multi-stacked capacitor of FIG. 1.
Figure 3:
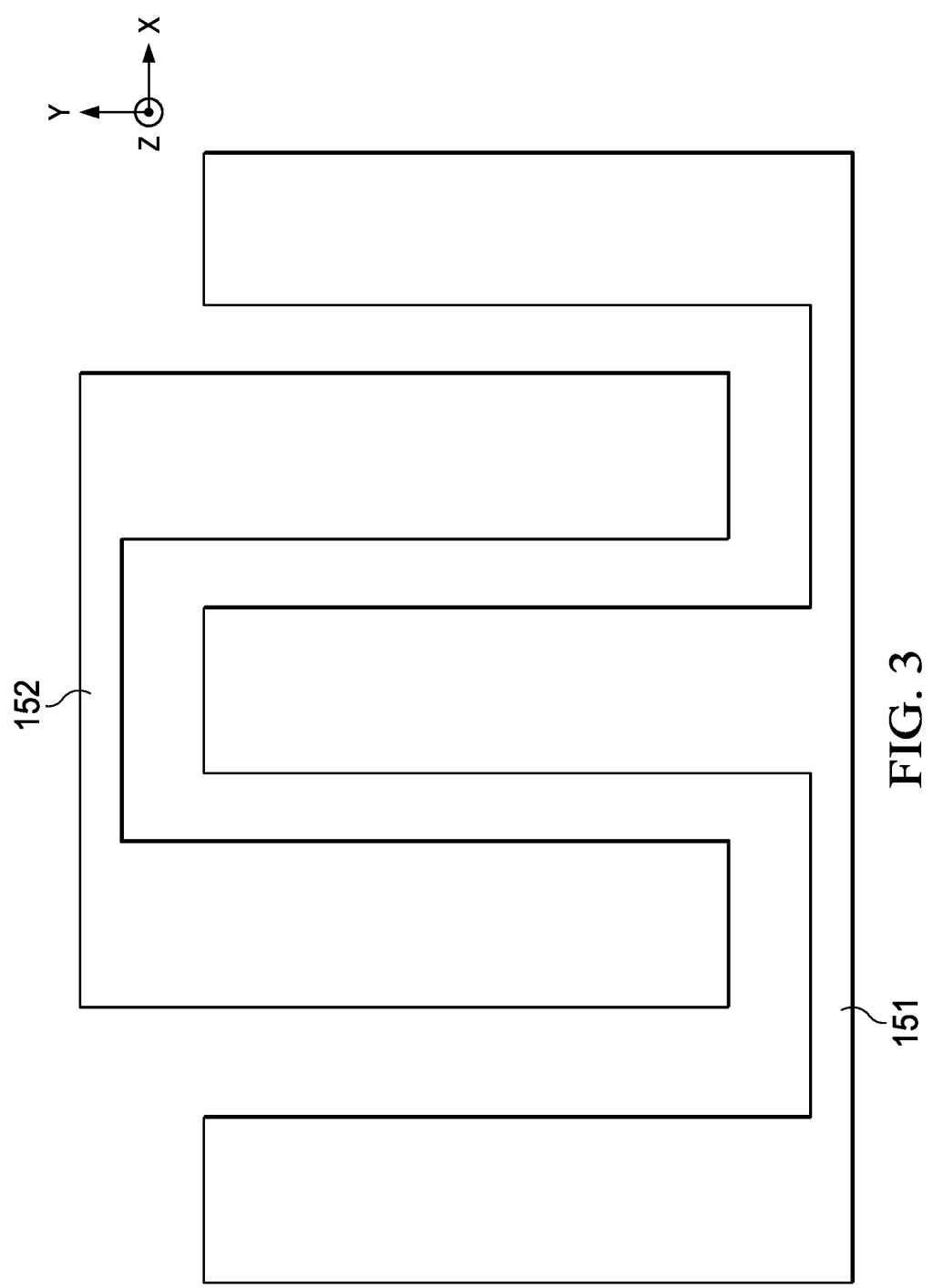
FIG. 3 illustrates a top view of first and second electrode pads of FIG. 1.

FIG. 1 illustrates a cross-sectional view of an example multi-stacked capacitor and an example integrated circuit 101. The integrated circuit 101 includes the multi-stacked capacitor 100. The integrated circuit 101 may further include other components, such as transistors, according to actual application scenarios. The multi-stacked capacitor (also referred to as "stacked capacitor") 100 includes a capacitor stack 120 that includes multiple dielectric layers 121, 123, 125, 127, and base plate 110 (which is also a conductive plate) and conductive plates 122, 124, 126, 128. The base plate 110 has a first surface 111 and a second opposing surface 112. The multi-stacked capacitor 100 further includes an insulating layer 130, vias 141 to 145 extending through insulating layer 130 and in contact with the base plate 110 and the conductive plates 122, 124, 126, 128 respectively, and a first electrode pad 151 and a second electrode pad 152. FIG. 2 illustrates a plan view of components of the example multi-stacked capacitor of FIG. 1, in which the base plate 110, the conductive plates 122, 124, 126, 128, dielectric layers 121, 123, 125, 127, and vias 141 to 145 are shown, while the insulating layer 130 and the electrode pads 151 and 152 are not shown for simplicity. FIG. 3 illustrates a top view of first and second electrode pads 151 and 152 of FIG. 1.

The conductive plates 110, 122, 124, 126, 128 and the multiple dielectric layers 121, 123, 125, 127 are stacked in an alternating arrangement as shown. In the example of FIG. 1, the dielectric layer 121 is on or over the base plate 110 (or the second surface 112 of the base plate 110), the conductive plate 122 is on or over the dielectric layer 121, the dielectric layer 123 is on or over the conductive plate 122, the conductive plate 124 is on or over the dielectric layer 123, and so on. The base plate 100 may include a metal plate or other suitable conductive plate. The dielectric layer (such as 121, 123, 125, 127) may include at least one of silicon oxide (such as $SiO_2$), silicon nitride, aluminum oxide, titanium oxide, or lead zirconate titanate (PZT). The conductive plate (such as 110, 122, 124, 126, 128) may include at least one of titanium nitride, copper, or tantalum nitride. In the present disclosure, if component A is on component B, component A is in direct contact with component B. If component A is over component B, component A is not necessarily in direct contact with component B. For example, there may be component C between component A and component B.

The dielectric layers 121, 123, 125, 127 have sloped sides 121S, 123S, 125S, 127S, respectively. The conductive plates 122, 124, 126, 128 have sloped sides (e.g., sloped contact sides) 122S, 124S, 126S, 128S, allowing multiple conductive plates 122, 124, 126, 128 of the capacitor stack to be conductively coupled to respective vias. The capacitor 100 is a multi-stacked capacitor, because the capacitor stack 120 of the capacitor 100 includes multiple dielectric layers and conductive plates staked together. In the example of FIG. 1, the capacitor stack 120 includes four dielectric layers 121, 123, 125, 127 and five conductive plates 110, 122, 124, 126, 128. In certain examples, the capacitor stack 120 of the stacked capacitor 100 includes at least two dielectric layers and at least three conductive plates, where the at least three conductive plates include a base plate.

The insulating layer 130 is on or over the capacitor stack 120. The insulating layer 130 may be an oxide layer. The insulating layer 130 may include silicon oxide (such as $SiO_2$) or other suitable insulating material. FIG. 1 also illustrates a coordinate system having X, Y, and Z axes. The X-axis and the Y-axis are orthogonal to each other and are parallel to a plane of the base plate 110, e.g., the first surface 111 and/or the second surface 112 of the base plate 110. The X and Y-axes are thus referred to as "in-plane direction," which can also be referred to as "lateral direction." The Z-axis is perpendicular to the X and Y-axes and thus perpendicular to the plane of the base plate 110. Accordingly, the Z-axis is referred to as an "out-of-plane direction," which can also be referred to as "vertical direction."

The vias (such as 141 to 145) extend, along a direction perpendicular to the second surface 112 of the base plate 110 (−Z direction), through the insulating layer 130 to the conductive plates (such as 110, 122, 124, 126, 128), respectively. In the example of FIG. 1, one or more vias 141 extend, along the −Z direction, through the insulating layer 130, and in contact with the second surface 112 of the base plate 110. The base plate 110 has a portion 113 exposed from the conductive plates 122, 124, 126, 128, and is configured to be in contact with via 141. Via 141 is conductively coupled to and in contact with the base plate 110, and can also be referred to as a "base via." Vias 142, 143, 144, 145 extend, along the −Z direction, through the insulating layer 130, and in contact with and conductively coupled to sloped sides 122S, 124S, 126S, 128S of the conductive plates 122, 124, 126, 128, respectively. Vias (such as 141 to 145) may include tungsten, or other suitable conductive material.

In the example of FIG. 1, the capacitor stack 120 has a sloped side (e.g., a sloped contact side) 120S, and the sloped side 120S of the capacitor stack 120 includes sloped sides (e.g., sloped contact sides) 122S, 124S, 126S, 128S of the conductive plates 122, 124, 126, 128 and sloped sides 121S, 123S, 125S, 127S of the dielectric layers 121, 123, 125, 127. In the example of FIG. 1, the sloped side 120S, sloped sides 121S, 123S, 125S, 127S, and sloped sides 122S, 124S, 126S, 128S have a same or equal slope with a slope angle 1AA with respect to the second surface 112 of the base plate 110. In some examples, the slope angle 1AA of the slope of the sloped side 120S is chosen to be sufficiently less than 90 degrees, such that a lateral distance between a bottom edge and a top edge of a sloped side (e.g., 122S, 124S, 126S, 128S) of a conductive plate (e.g., a lateral width of a sloped side of a conductive plate along X direction) is greater than a lateral width of the respective via thereon.

In certain examples, the slope angle of the slope of the sloped side (such as, 120S, 121S, 123S, 125S, 127S, 122S, 124S, 126S, 128S) with respect to the second surface 112 of the base plate 110 is in a range of 10 degrees to 80 degrees, such as 10 degrees, 20 degrees, and may be chosen according to various application scenarios. Variation of the slope angle (i.e., the amount by which the angles vary) may be +1-5 degrees, or other suitable values depending on actual application scenarios.

In the example of FIG. 1, via 145 is in contact with sloped side 128S of conductive plate 128. In other examples, via 145 can be in contact with a surface (such as a top surface) 128B of the conductive plate 128, as the conductive plate 128 is closer to the insulating layer 130 as compared to the other conductive plates 122, 124, 126, and via 145 does not contact other conductive plates 122, 124, 126 when extending through the insulating layer 130 to reach the surface 128B of the conductive the plate 128.

In some examples, a thickness of conductive plate (such as 122, 124, 126, 128) has a value in a range of 5 nm to 10 μm, and a thickness of dielectric layer (such as 121, 123, 125, 127) has a value in a range of 2 nm to 1000 nm, and a width or diameter of via (such as 141 to 145) has a value in a range of 10 nm to 2 μm. In another example, the via (such as 141 to 145) is a stripe via for increased currents, and the stripe via extends with an elongated length or dimension in Y direction and has a width of 10 nm to 2 μm in X direction. In certain examples, the thickness of conductive plate (such as 122, 124, 126, 128) has a value of 170 nm, and a thickness of dielectric layer (such as 121, 123, 125, 127) has a value of 30 nm, and the width or diameter of via (such as 141 to 145) has a value of 255 nm. The slope of the sloped side 120S is selected to achieve sufficient lateral separation between 122S, 124S, 126S, and 128S and sufficient lateral sizes of 122S, 124S, 126S, and 128S to allow formation of vias 142-145 to a single conductive plate 122-128.

FIG. 3 illustrates a top view of example electrode pads of FIG. 1. Referring to FIGS. 1 and 3, the electrode pad 151 is conductively coupled to and in contact with vias 141, 143, 145, such that the based plate 110 and the conductive plates 124, 128 are conductively coupled to the electrode pad 151. The electrode pad 152 is conductively coupled to and in contact with vias 142, 144, such that the conductive plates 122, 126 are conductively coupled to the electrode pad 152.

The electrode pads 151 and 152 may include aluminum, or other suitable conductive material. In the examples of FIGS. 1 and 2, vias 141 to 145 may have column shape, and lateral dimension (e.g., in-plane dimension in X-Y plane) of the column are the same. In other examples, along the −Z direction, lateral dimension of the column can be reduced.

Various types of couplings or connections can be chosen for the conductive plates (such as 110, 122, 124, 126, 128) of the multi-stacked capacitor 100 for use in, e.g., a chip, device, or integrated circuit; and accordingly, the multi-stacked capacitor 100 can have various capacitances or capacities depending on the respective types of couplings or connections. In some examples, the conductive plate 122 is conductively coupled to a first electrode pad, and the conductive plate 124 is conductively coupled to a second electrode pad, and the conductive plates 122, 124 and the dielectric layer 123 therebetween form or serve as a first capacitor of the multi-stacked capacitor 100; and the conductive plate 126 is conductively coupled to the first electrode pad, and the conductive plate 128 is conductively coupled to the second electrode pad, and the conductive plates 126, 128 and the dielectric layer 127 therebetween form or serve as a second capacitor of the multi-stacked capacitor 100, and the first capacitor and the second capacitor are connected or coupled in parallel to increase the capacitance or capacity of the multi-stacked capacitor 100. In certain examples, the conductive plates 122, 124 and the dielectric layer 123 therebetween form or serve as a first capacitor of the multi-stacked capacitor 100, the conductive plates 126, 128 and the dielectric layer 127 therebetween form or serve as a second capacitor of the multi-stacked capacitor 100; and the first capacitor and the second capacitor are connected or coupled in series to reduce or adjust the capacitance or capacity of the multi-stacked capacitor 100. In another example, the conductive plates 122, 124 and the dielectric layer 123 therebetween form or serve as a first capacitor of the multi-stacked capacitor 100; the conductive plates 126, 128 and the dielectric layer 127 therebetween form or serve as a second capacitor of the multi-stacked capacitor 100; and the first capacitor and the second capacitor are separate (e.g., without being connected or coupled in parallel or in series).

FIGS. 4 to 12 and 1 illustrate cross-sectional views of example structures of various stages of the formation of the example multi-stacked capacitor 100, and accordingly illustrate an example method of forming the multi-stacked capacitor 100.

Figure 4:
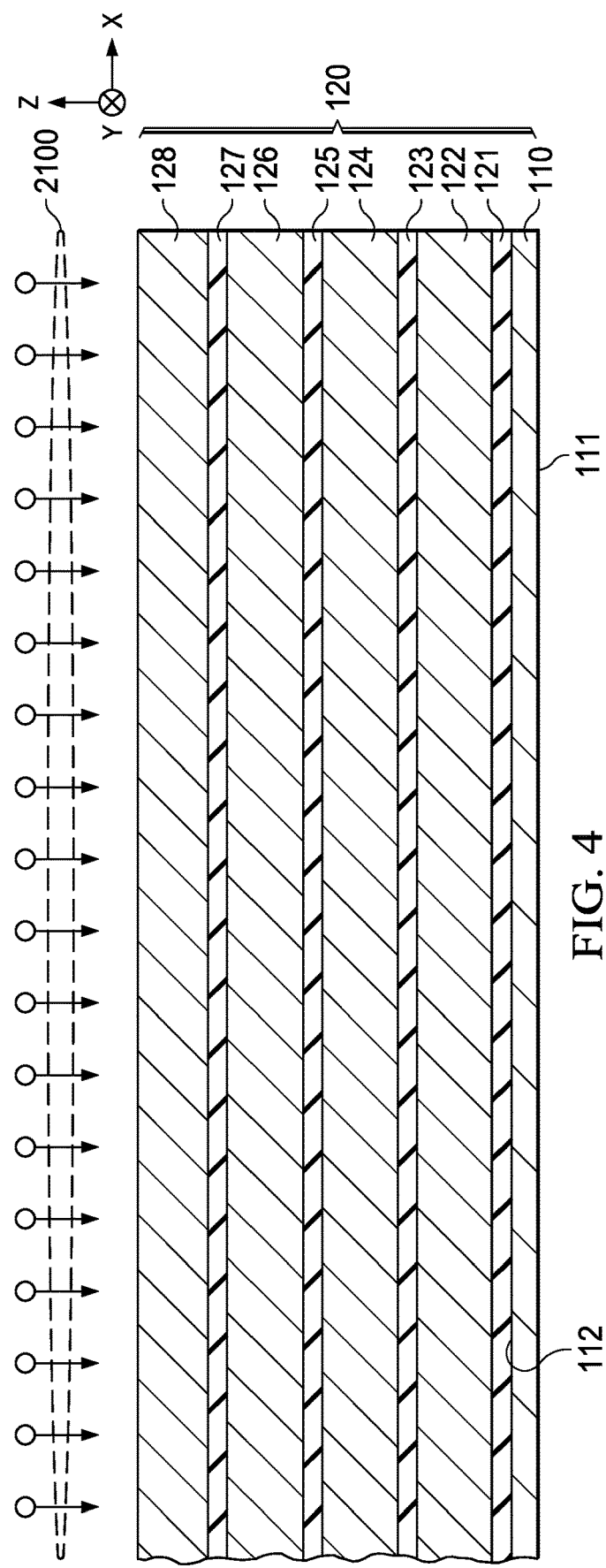
FIGS. 4 to 12 illustrate cross-sectional views of example structures of various stages of the formation of the multi-stacked capacitor of FIG. 1.

FIG. 4 illustrates forming a capacitor stack 120 by deposition 2100. The deposition 2100 may include depositing conductive plates 110, 122, 124, 126, 128 (including the base plate 110) and dielectric layers 121, 123, 125, 127, alternately over a substrate (not shown). The dielectric layer 121 is deposited on or over the base plate 110, and the conductive plate 122 is deposited on or over the dielectric layer 121, and further the dielectric layer 123 is deposited on or over the conductive plate 122, and the conductive plate 124 is deposited on or over the dielectric layer 123, and so on. In some examples, the deposition 2100 includes vapor deposition such as chemical vapor deposition or physical vapor deposition, or other suitable deposition technique or process. In certain examples, the deposition 2100 includes depositing at least three conductive plates (including a base plate) and at least two dielectric layers, alternately over a substrate, and the capacitor stack 120 includes at least two dielectric layers and at least three conductive plates that include the base plate.

In some examples, the base plate 110 and the conductive plates 122, 124, 126, 128 include same material and are deposited using same material. In other examples, the base plate 110 and the conductive plates 122, 124, 126, 128 include different materials and are deposited using different materials. For example, the base plate 110 includes aluminum, while the conductive plates 122, 124, 126, 128 include titanium nitride. In another example, the base plate 110 includes titanium nitride, while the conductive plates 122, 124, 126, 128 include aluminum.

Figure 5:
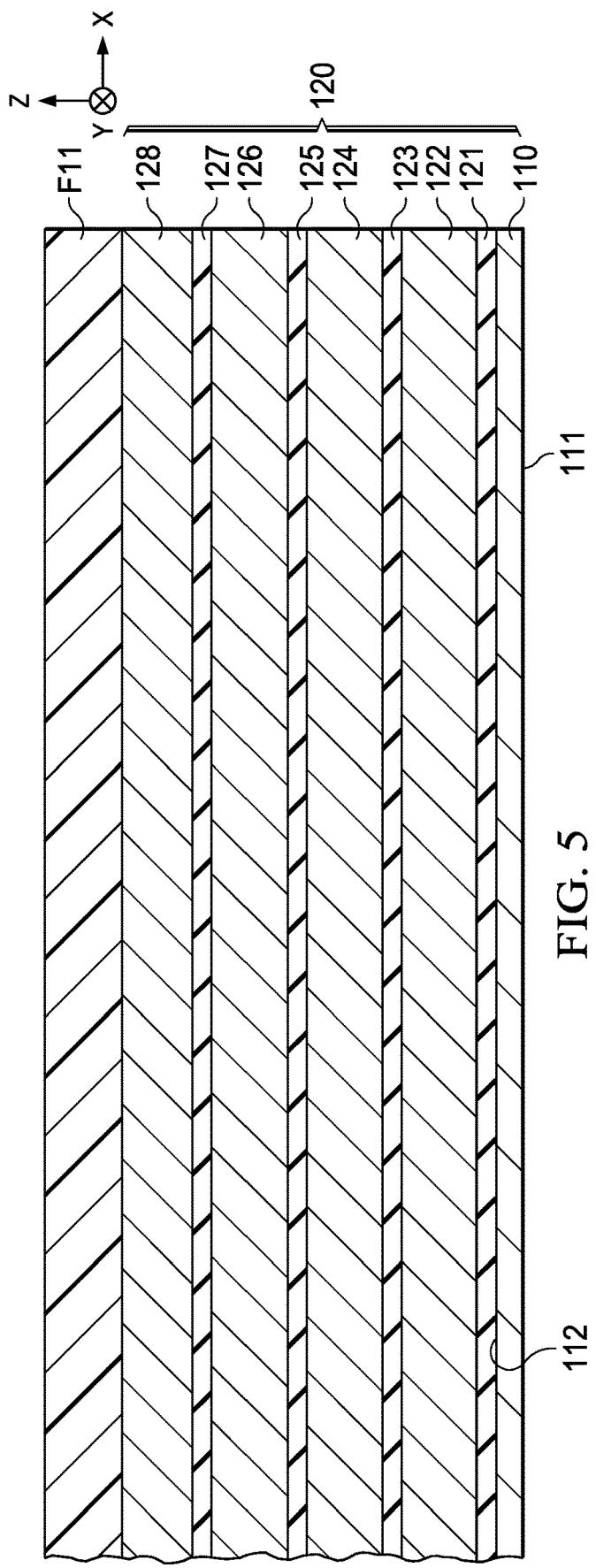

FIG. 5 illustrates coating a photoresist film F11 on or over the capacitor stack 120. The photoresist film F11 may be coated on or over the capacitor stack 120 by spin coating, spray coating, electrodeposition, or other suitable technique.

Figure 6:
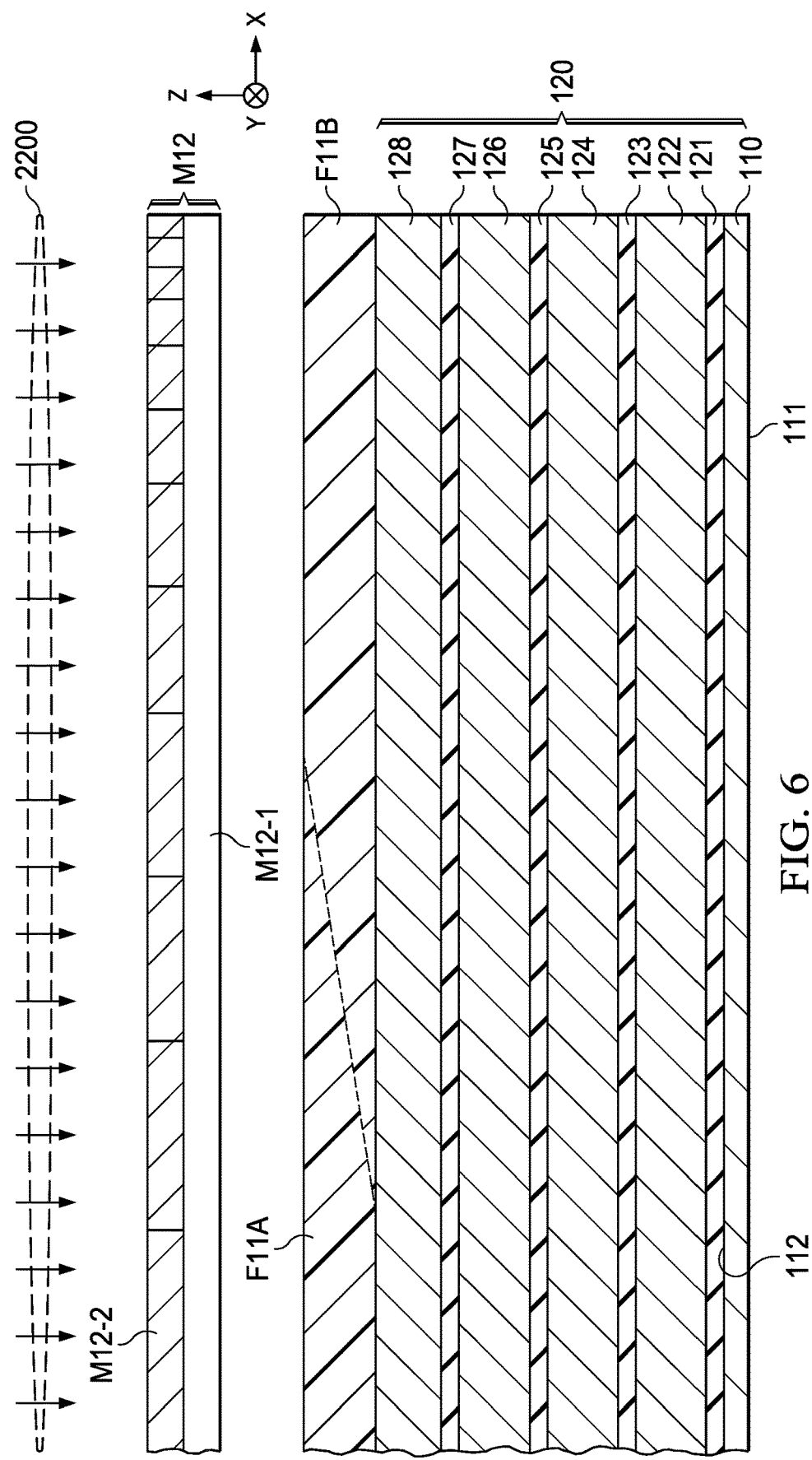
Figure 7:
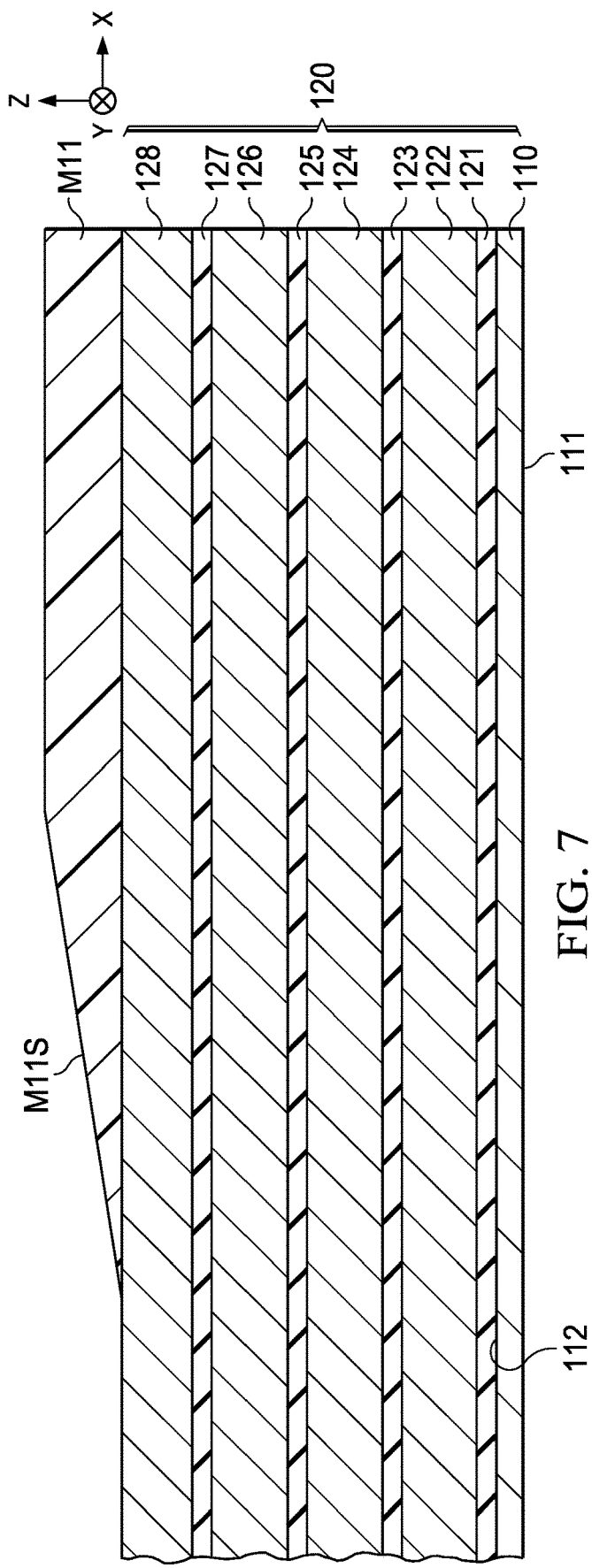

FIGS. 6 and 7 illustrate patterning the photoresist film F11 into a patterned photoresist mask M11 having at least one sloped side (such as M11S) with respect to the second surface 112 of the base plate 110. FIG. 6 shows patterning the photoresist film F11 by using ultraviolet light and a gray-scale mask M12; and FIG. 7 shows respective patterned photoresist mask M11. More specifically, patterning the photoresist film F11 may be performed by a process 2200 that introduces ultraviolet light, through the gray-scale mask M12, to the photoresist film F11 to cause a portion F11A of the photoresist film F11 to become acidified, and by a resist-development process that develops away (e.g., removes) the acidified portion F11A of the photoresist film F11 and keeps an unacidified portion F11B of the photoresist film F11 to form the patterned photoresist mask M11 having at least one sloped side M11S with a slope angle with respect to the second surface 112 of the base plate 110.

The gray-scale mask M12 includes a transparent quartz plate or blank M12-1 and a light-shielding patterned chromium layer M12-2 on or over the transparent quartz plate M12-1. The gray-scale mask M12 includes portions in which the amount of UV light that can pass through is gradually reduced along +X direction; and accordingly the acidified portion F11A of the photoresist film F11 includes portions with thickness gradually reduced along +X direction, and the unacidified portion F11B of the photoresist film F11 includes portions with thickness gradually increased along +X direction, resulting in the sloped side Ml1S of the patterned photoresist mask M11.

Figure 8:
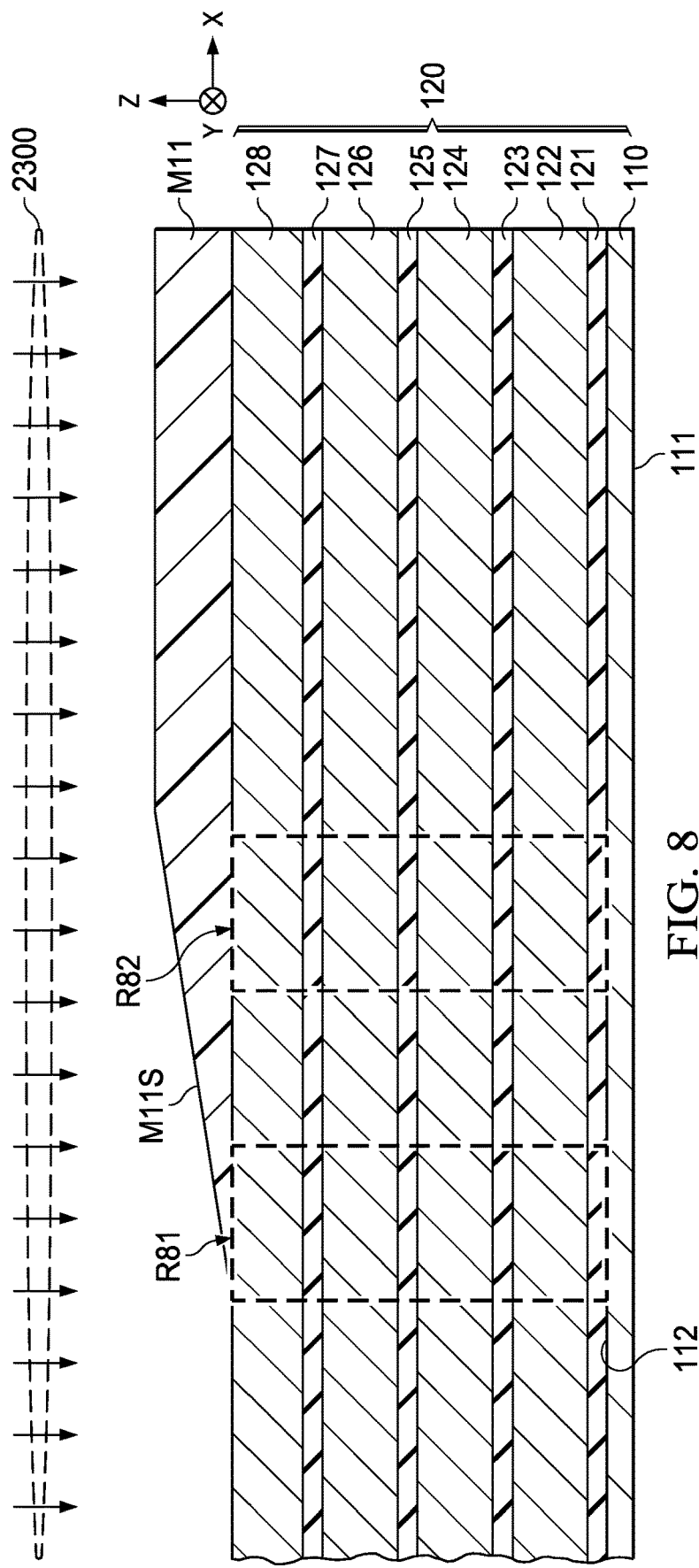
Figure 9:
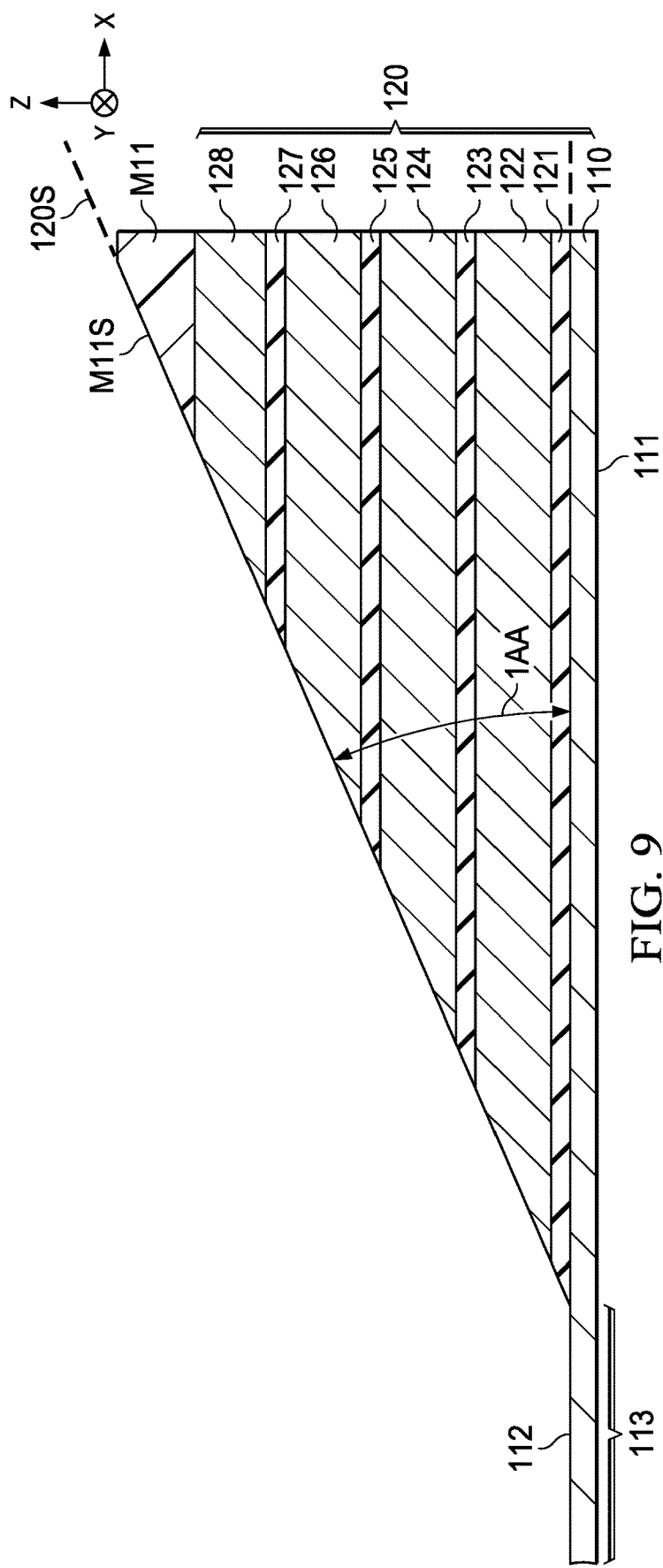

FIGS. 8 and 9 illustrate transferring at least one slope of the single same patterned photoresist mask (e.g., M11) to the capacitor stack to form at least one sloped contact side of the capacitor stack. Referring to FIG. 8, the slope transferring process 2300 includes using etching and the single same patterned photoresist mask M11 to transfer at least one slope (e.g., slope profile). In some examples, the slope transferring process 2300 includes etching at least two dielectric layers and at least two conductive plates of the capacitor stack 120 while having the single same patterned photoresist mask M11 on or over the capacitor stack 120. FIG. 9 shows the respective etched capacitor stack 120 with sloped side 120S.

In the etching of the slope transferring process 2300, the patterned photoresist mask M11 is also etched, and the sloped side Ml1S of the patterned photoresist mask M11 is shifted towards +X direction. Because of the sloped side M11S, etching on portions (e.g., in region R81) of the capacitor stack 120 corresponding to thinner portion of the sloped side M11S of the patterned photoresist mask M11 starts earlier than etching on portions (e.g., in region R82) of the capacitor stack 120 corresponding to thicker portion of the sloped side M11S of the patterned photoresist mask M11. Accordingly, the sloped side 120S of the etched capacitor stack 120 is formed (see FIG. 9), providing contact points or locations for vias (such as 142 to 145 in FIG. 1). In the example of FIGS. 8 and 9, the etching of the slope transferring process 2300 exposes a portion 113 of the base plate 110 from the conductive plates 122, 124, 126, 128. The portion 113 of the base plate 110 may be configured to be in contact with a via.

During the etching of the slope transferring process 2300, the conductive plates 122, 124, 126, 128 and the dielectric layers 121, 123, 125, 127 starts being exposed to etching along −Z direction, e.g., alternately. That is, the conductive plate 128 starts being exposed to etching, and further the dielectric layer 127 starts being exposed to etching, and further the conductive plate 126 starts being exposed to etching, and so on. In some examples, the etching of the slope transferring process 2300 includes applying a first etching configuration and a second etching configuration alternately according to the alternate conductive plates and dielectric layers. Although a same etching configuration may still be used during the etching of the slope transferring process 2300, because the conductive plate (such as 122, 124, 126, 128) and the dielectric layer (such as 121, 123, 125, 127) are different from each other, such as having different materials, using different etching configurations alternately during the etching of the slope transferring process 2300 may improve control over the formation of the sloped side 120S of the capacitor stack 120. In some examples, the first etching configuration is chosen according to the conductive plates (such as 122, 124, 126, 128), and the second etching configuration is chosen according to the dielectric layers (such as 121, 123, 125, 127).

In certain examples, the first etching configuration corresponds to or includes a first etching agent suitable for the conductive plates (such as 122, 124, 126, 128), such as a chlorine-based etching agent, e.g., $Cl_2$ (chlorine or dichlorine solution), $BCl_3$ (boron trichloride) or any mixture thereof; and the second etching configuration corresponds to or includes a second etching agent suitable for the dielectric layers (such as 121, 123, 125, 127), such as a fluorine-based etching agent (e.g., $CHF_3$, $CF_4$, $C_5F_8$, or any mixture thereof).

In some scenarios, if a same etching configuration (such as a same etch rate) is applied to the conductive plates and the dielectric layers, etching rates may be too fast or too slow for forming desired sloped sides on the conductive plates or the dielectric layers. For example, if the etching rate is too fast for the conductive plates, vertical walls along Z direction or steep sloped sides (instead of desired sloped side) with increased slope angles may be formed for the conductive plates, and the difficulty for respective vias to be in contact with the conductive plates may be increased. If the etching rate is too slow for the conductive plates, sloped sides with reduced slope angles may extend unnecessarily long in X direction, lateral areas (such as along X direction) occupied by the sloped sides may be unnecessarily large as compared to needed areas for contacting vias, and accordingly efficiency of using area may be reduced.

In some examples, the first etching configuration corresponds to or include first etch rates for the conductive plates (such as 122, 124, 126, 128), and the second etching configuration corresponds to or includes second etch rates for the dielectric layers (such as 121, 123, 125, 127), and the second etch rates for the dielectric layers are higher than the first etch rates for the conductive plates.

Figure 10:
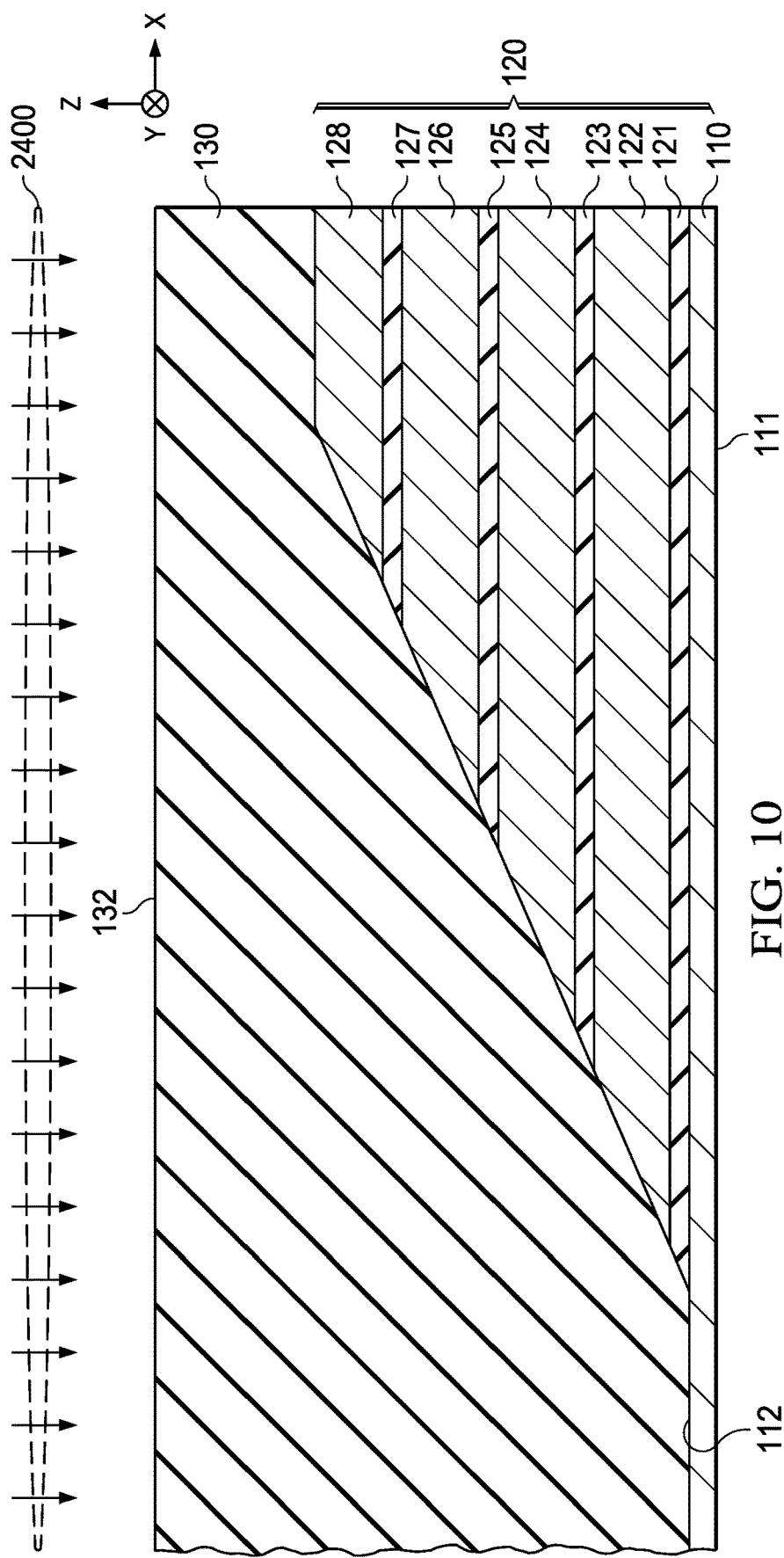

FIG. 10 illustrates depositing the insulating layer 130 on or over the capacitor stack 120 by a deposition process 2400. In some examples, the deposition process 2400 can include or use vapor deposition such as chemical vapor deposition or physical vapor deposition, or other suitable deposition technique or process. Further, a surface 132 (e.g., top surface) of the insulating layer 130 may be flattened by chemical mechanical planarization (CMP).

Figure 11:
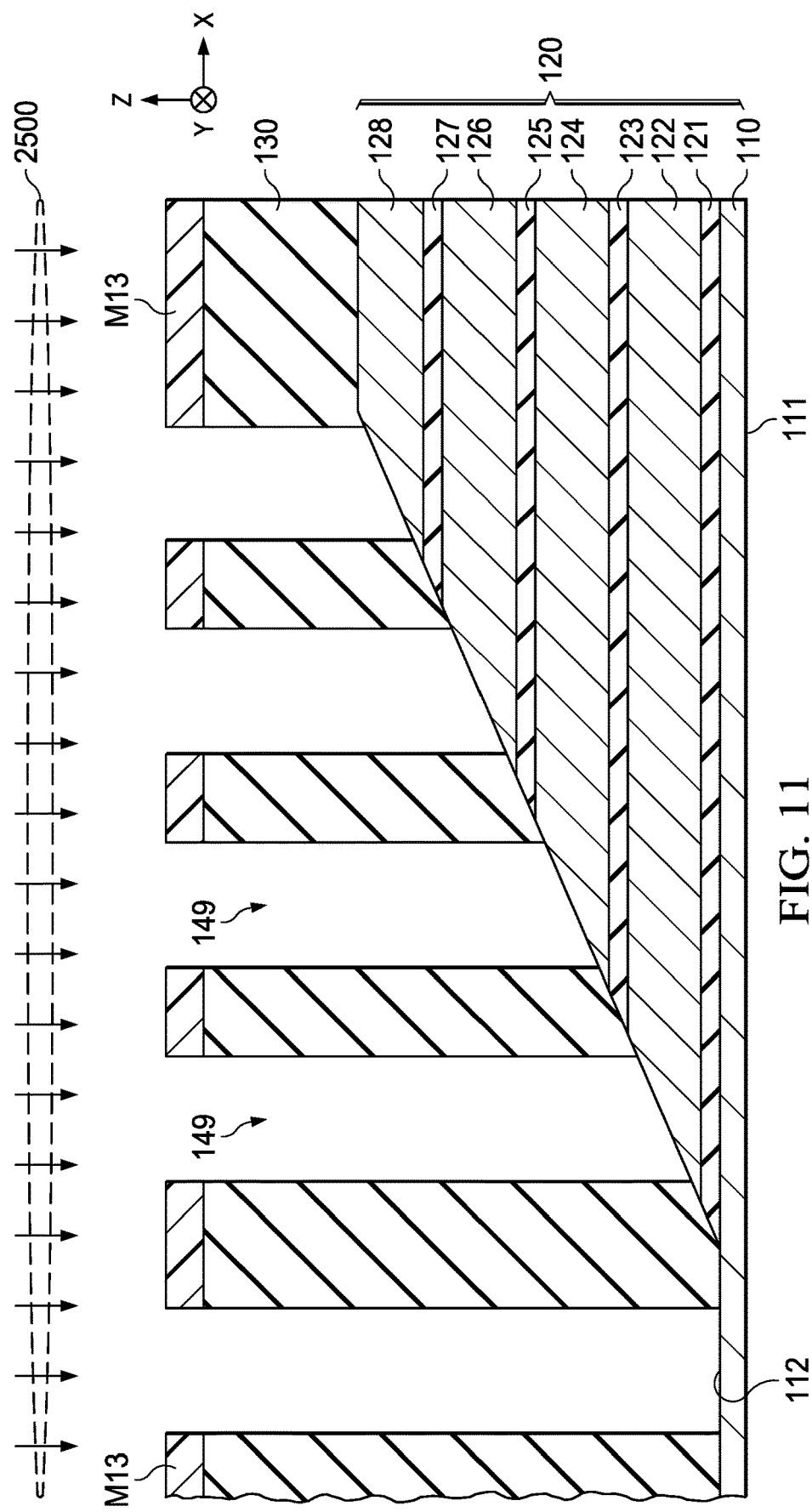

FIG. 11 illustrates forming via holes in the insulating layer 130 by an etching process 2500 through regions of the insulating layer 130 exposed and defined by the patterned photoresist mask M13. The patterned photoresist mask M13 exposes and defines regions of the insulating layer 130 for etching, and the regions of the insulating layer 130 exposed and defined by the patterned photoresist mask M13 are etched away to form via holes 149.

Figure 12:
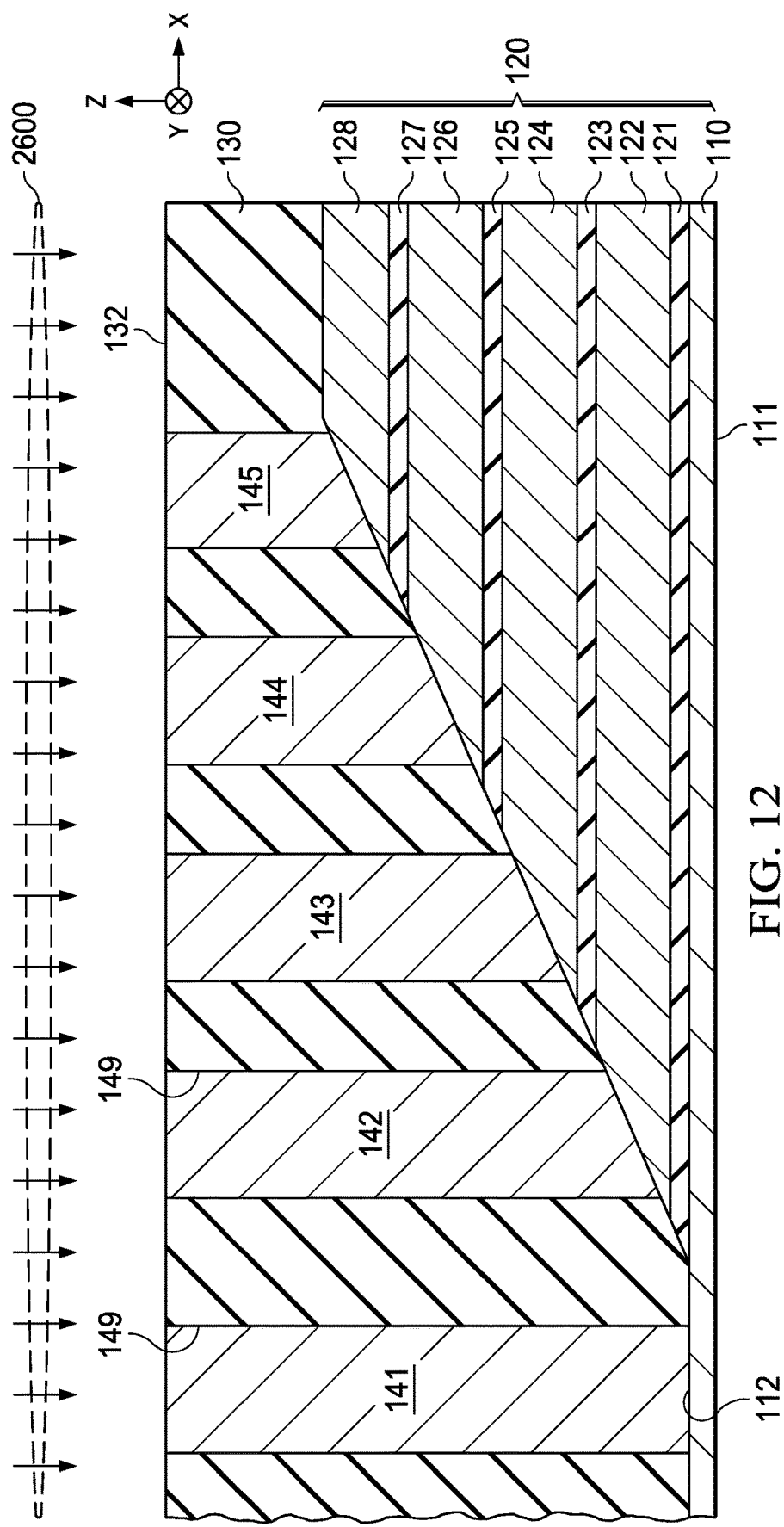

FIG. 12 illustrates forming vias in the via holes that extend through the insulating layer 130 by a deposition process 2600. The deposition process 2600 may include physical vapor deposition or other suitable deposition technique or process. The vias 141 to 145 extend from the surface 132 of the insulating layer 130 to plates including the base plate 110 and conductive plates 122, 124, 126, 128, respectively.

Returning to FIGS. 1 and 3, the first electrode pad 151 and the second electrode pad 152 are formed. The first electrode pad 151 is conductively coupled to a first group of plates (e.g., base plate 110 and conductive plates 124, 128), and the second electrode pad 152 is conductively coupled to a second group of plates (e.g., conductive plates 122, 126). The first electrode pad 151 and the second electrode pad 152 may be formed by depositing a metal layer on or over the insulating layer 130 and vias 141 to 145 and etching, by using a chlorine-based etching agent, the metal layer through exposed regions of the metal layer defined by a patterned photoresist mask or a patterned dielectric layer on the metal layer, where the patterned photoresist mask or the patterned dielectric layer is used to transfer a respective pattern. In some examples, the patterned dielectric layer, used as a hard mask, can be formed or patterned by using a photoresist mask and a fluorine-based etching agent, such as $CHF_3$, $CF_4$, $C_5F_8$ or any mixture thereof; and the respective pattern is further transferred to the metal layer for forming the first electrode pad 151 and the second electrode pad 152 using the patterned dielectric layer and a chlorine-based etching agent. In certain examples, for forming the first electrode pad 151 and the second electrode pad 152, the metal layer is etched with a chlorine-based etching agent, e.g., $Cl_2$ (chlorine or dichlorine solution), $BCl_3$ (boron trichloride) or any mixture thereof.

Figure 13:
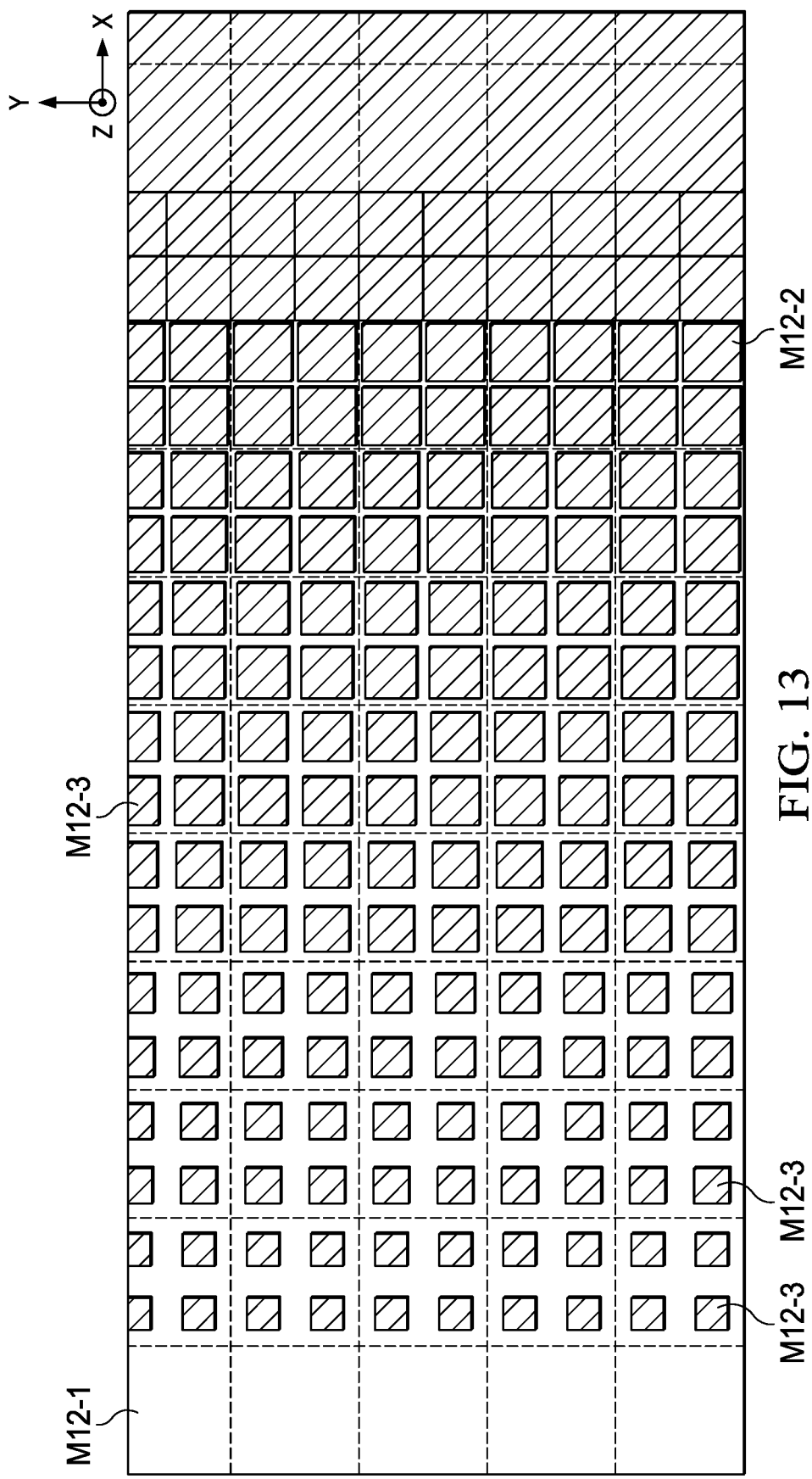
FIG. 13 illustrates an example plan view of the gray-scale mask of FIG. 6.

FIG. 13 illustrates an example plan view of the gray-scale mask M12 of FIG. 6. The gray-scale mask M12 include the transparent quartz plate or blank M12-1 and a light-shielding patterned chromium layer M12-2. The transparent quartz plate M12-1 allows UV light to pass through. The light-shielding patterned chromium layer M12-2 includes multiple chromium regions M12-3. The chromium regions M12-3 shield or block UV light from passing through. The sizes of individual chromium regions M12-3 are gradually increased along +X direction, and the area density of chromium regions M12-3 is gradually increased along +X direction. With the gradually-increased area density of chromium regions M12-3 along +X direction, the amount of UV light that passes through the mask M12 is gradually reduced along +X direction. Accordingly, the mask M12 is a grayscale mask.

In the example of FIG. 13, the region M12-3 has a square or rectangle shape. In other examples, the region M12-3 can have circular shape or other suitable shape. In the example of FIG. 13, the region M12-3 is a chromium region. In certain examples, the region M12-3 can be other type of region with other suitable material that can shield or block UV light from passing through.

Figure 14:
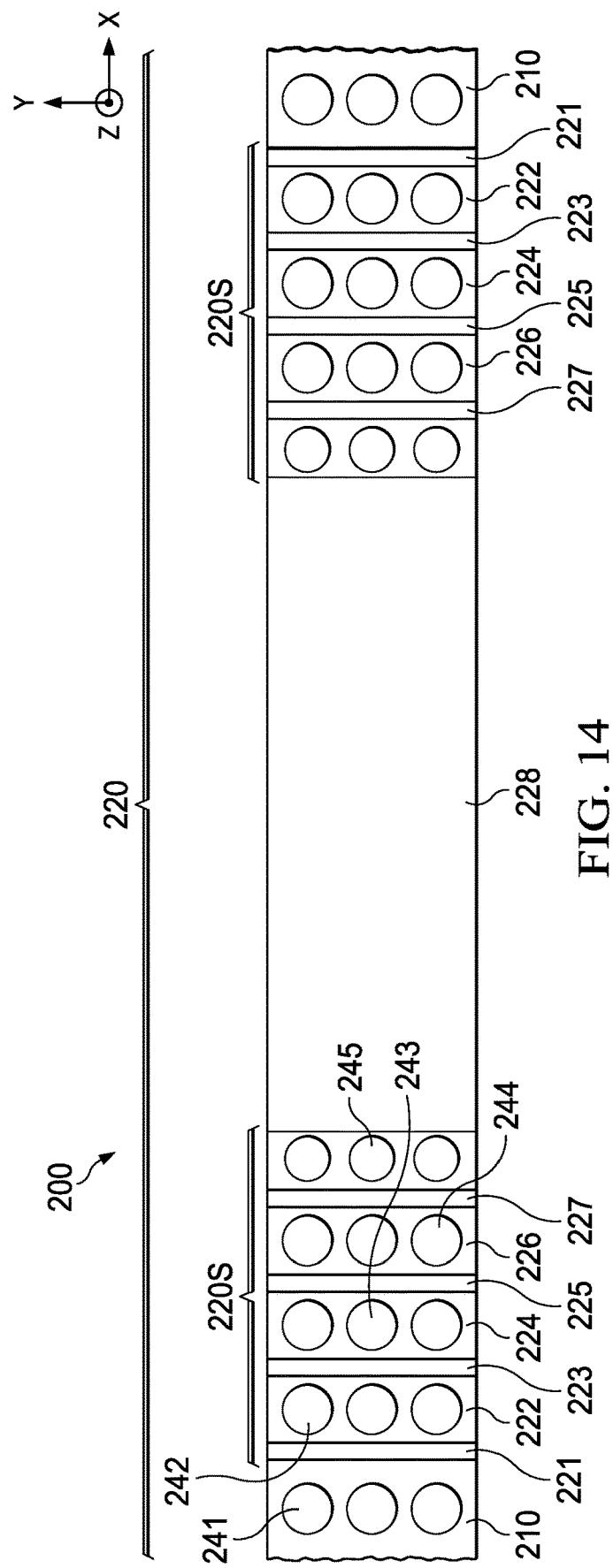
FIG. 14 illustrates a plan view of another example multi-stacked capacitor.

In a stacked capacitor of the present disclosure, a number of sloped sides of capacitor stack may be 1, 2, 3, 4 or other suitable positive integer, and can be chosen according to various application scenarios. The stacked capacitor of FIGS. 1 and 2 has a capacitor stack with one sloped side. FIG. 14 illustrates a plan view of another example multi-stacked capacitor 200, in which a capacitor stack 220 has two sloped sides. The multi-stacked capacitor (or stacked capacitor) 200 includes a capacitor stack 220 that includes multiple conductive plates 210, 222, 224, 226, 228 and dielectric layers 221, 223, 225, 227 stacked in an alternating arrangement, where conductive plate 210 is a base plate. The capacitor stack 220 has two sloped sides 220S. The multi-stacked capacitor further includes an insulating layer (not shown in FIG. 14), and vias 241 to 245 extending through insulating layer and in contact with the base plate 210 and in contact with the conductive plates 222, 224, 226, 228 at each sloped side 220S.

Figure 15:
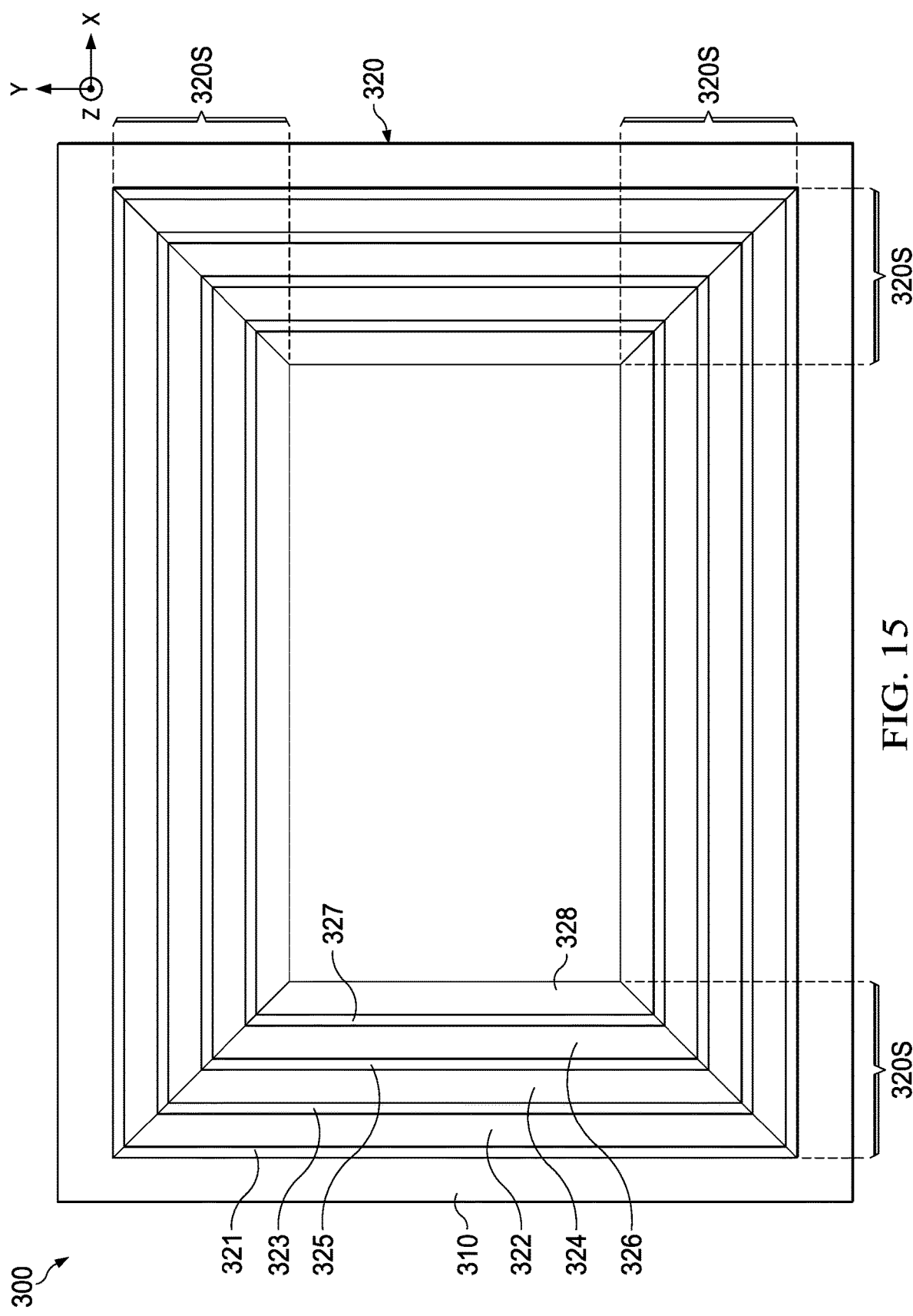
FIG. 15 illustrates a plan view of another example multi-stacked capacitor.

FIG. 15 illustrates a plan view of another example multi-stacked capacitor 300, in which a capacitor stack 320 has four sloped sides. The multi-stacked capacitor (or stacked capacitor) 300 includes a capacitor stack 320 that includes conductive plates 310, 322, 324, 326, 328 and multiple dielectric layers 321, 323, 325, 327 stacked in an alternating arrangement, where the conductive plate 310 is a base plate. The capacitor stack 320 has four sloped side 320S. The multi-stacked capacitor 300 may further includes an insulating layer and includes vias extending through the insulating layer and in contact with the conductive plates 322, 324, 326, 328 at each sloped side 320S and the base plate 310.

Figure 16:
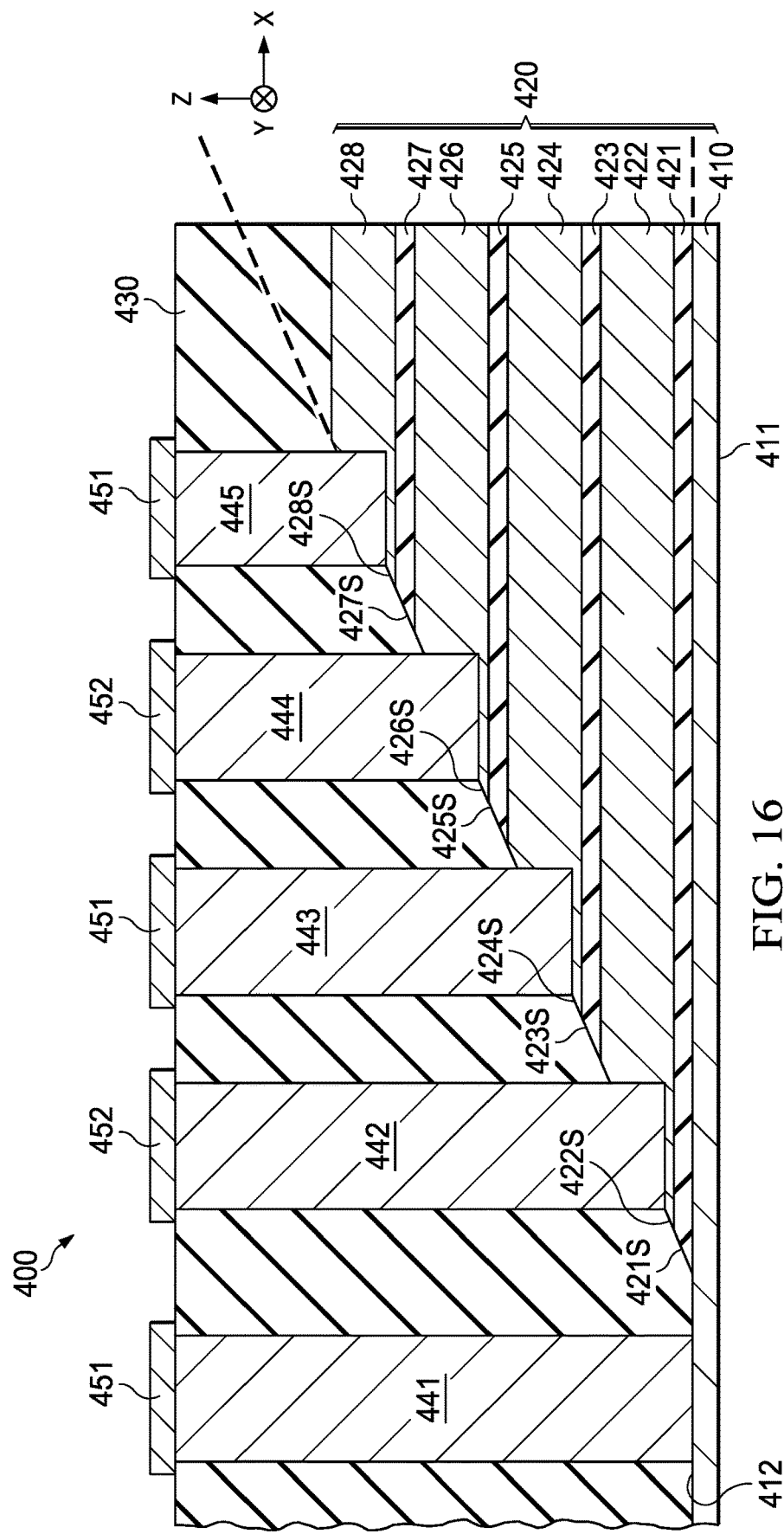
FIG. 16 illustrates a cross-sectional view of another example multi-stacked capacitor.

FIG. 16 illustrates a cross-sectional view of another example multi-stacked capacitor 400. The multi-stacked capacitor (or stacked capacitor) 400 includes a capacitor stack 420 that includes conductive plates 410, 422, 424, 426, 428 and dielectric layers 421, 423, 425, 427 stacked in an alternating arrangement as shown, and an insulating layer 430, and vias 441 to 445 extending through insulating layer 430 and in contact with the conductive plates 410, 422, 424, 426, 428, and a first electrode pad 451 and a second electrode pad 452. The conductive plates 410 has a first surface 411 and a second opposing surface 412, and can also be referred to as a "base plate."

The dielectric layers 421, 423, 425, 427 have sloped sides 421S, 423S, 425S, 427S, respectively. The conductive plates 422, 424, 426, 428 have sloped sides 422S, 424S, 426S, 428S. The vias (such as 441 to 445) extend, along a direction perpendicular to the second surface 412 of the base plate 410 (−Z direction), through the insulating layer 430 to the plates, respectively, e.g., the base plate 410 and conductive plates (such as 422, 424, 426, 428). Vias 442, 443, 444, 445 extend, along the −Z direction, through the insulating layer 430, and in contact with and conductively coupled to sloped sides 422S, 424S, 426S, 428S of the conductive plates 422, 424, 426, 428, respectively. In the example of FIG. 16, when vias 442, 443, 444, 445 are in contact with and conductively coupled to sloped sides 422S, 424S, 426S, 428S respectively, vias 442, 443, 444, 445 partially extend into the sloped sides 422S, 424S, 426S, 428S respectively. Such connections may be formed by etching away a portion of the sloped side (such as 422S, 424S, 426S, 428S) when forming the via hole of the respective via, and then depositing via material to form the respective via (such as 442, 443, 444, 445) for the sloped side.

Figure 17:
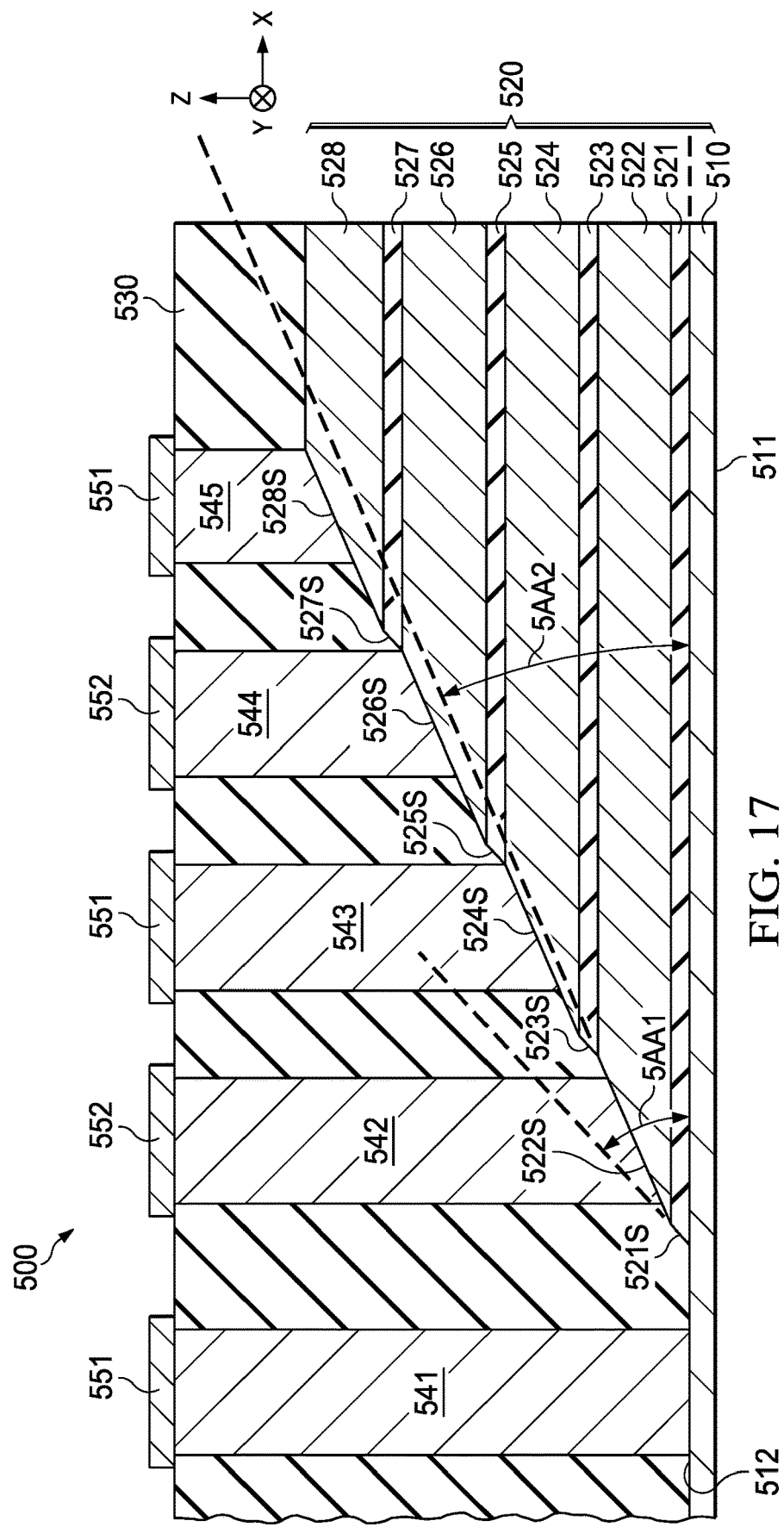
FIG. 17 illustrates a cross-sectional view of another example multi-stacked capacitor.

FIG. 17 illustrates a cross-sectional view of another example multi-stacked capacitor 500. The multi-stacked capacitor (or stacked capacitor) 500 includes a capacitor stack 520 that includes conductive plates 510, 522, 524, 526, 528 and dielectric layers 521, 523, 525, 527 stacked in an alternating arrangement, an insulating layer 530, and vias 541 to 545 extending through insulating layer 530 and in contact with the base plate 510 and the conductive plates 522, 524, 526, 528, and a first electrode pad 551 and a second electrode pad 552. The conductive plate 510 is a base plate 510 and has a first surface 511 and a second opposing surface 512.

The dielectric layers 521, 523, 525, 527 have sloped sides 521S, 523S, 525S, 527S, respectively. The conductive plates 522, 524, 526, 528 have sloped sides 522S, 524S, 526S, 528S, respectively. The vias (such as 541 to 545) extend, along a direction perpendicular to the second surface 512 of the base plate 510 (−Z direction), through the insulating layer 530 to the plates, respectively, e.g., the base plate 510 and conductive plates (such as 522, 524, 526, 528). Vias 542, 543, 544, and 545 extend, along the −Z direction, through the insulating layer 530, and in contact with and conductively coupled to sloped sides 522S, 524S, 526S, 528S of the conductive plates 522, 524, 526, 528, respectively.

In the example of FIG. 1, the sloped sides 121S, 123S, 125S, 127S, and sloped sides 122S, 124S, 126S, 128S have a same or equal slope. In contrast, in the example of FIG. 17, the sloped sides 121S, 123S, 125S, 127S, and sloped sides 122S, 124S, 126S, 128S have different or unequal slopes with different or unequal slope angles.

More specifically, the sloped sides 521S, 523S, 525S, 527S have a slope with a slope angle 5AA1 with respect to the second surface 512 of the base plate 510, and the sloped sides 522S, 524S, 526S, 528S have a slope with angle 5AA2 with respect to the second surface 512 of the base plate 510. The angle 5AA1 has a different value as compared to angle 5AA2. In the example of FIG. 17, the angle 5AA1 is larger than angle 5AA2. In other examples, the angle 5AA1 is smaller than angle 5AA2. The angles of the slopes may be controlled by, e.g., adjusting etching configurations of the etching of the respective slope transferring process. In certain examples, the sloped sides 521S, 523S, 525S, 527S have different slopes with different slope angles, and the sloped sides 522S, 524S, 526S, 528S have different slopes with different slope angles.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Modifications are possible in the described embodiments, and other embodiments are possible, within the scope of the claims.

What is claimed is:

1. A stacked capacitor, comprising:
   a capacitor stack including:
     a base plate having a first surface and a second opposing surface,
     a first dielectric layer on or over the base plate,
     a first conductive plate on or over the first dielectric layer,
     a second dielectric layer on or over the first conductive plate, and
     a second conductive plate on or over the second dielectric layer, wherein:
   the capacitor stack has a sloped side sloped with respect to the second surface of the base plate;
   an insulating layer over the capacitor stack and the sloped side; and
   a plurality of vias through the insulating layer to the capacitor stack, including a first via that connects to a portion of the first conductive plate exposed at the sloped side and a second via that connects to a portion of the second conductive plate exposed at the sloped side.

2. The stacked capacitor of claim 1, wherein the sloped side has an angle in a range of ten degrees to eighty degrees with respect to the second surface of the base plate.

3. The stacked capacitor of claim 1, further comprising:
   a base via extending through the insulating layer, and in contact with the second surface of the base plate, wherein the base plate has a portion exposed from the first conductive plate and the second conductive plate.

4. The stacked capacitor of claim 3, further comprising:
   a first electrode pad conductively coupled to the base via and the second via; and
   a second electrode pad conductively coupled to the first via.

5. The stacked capacitor of claim 1, wherein:
   the sloped side of the first conductive plate has a first slope with respect to the second surface of the base plate.

6. The stacked capacitor of claim 5, wherein:
   the sloped side of the first dielectric layer has a second slope with respect to the second surface of the base plate.

7. The stacked capacitor of claim 6, wherein the first slope and the second slope have a same or equal slope angle with respect to the second surface of the base plate.

8. The stacked capacitor of claim 6, wherein the first slope and the second slope have different slope angles with respect to the second surface of the base plate.

9. The stacked capacitor of claim 1, wherein:
   the first dielectric layer includes at least one of silicon oxide, silicon nitride, aluminum oxide, titanium oxide, or lead zirconate titanate.

10. The stacked capacitor of claim 1, wherein:
    the first conductive plate includes at least one of titanium nitride, copper, or tantalum nitride.

11. The stacked capacitor of claim 1, wherein the plurality of vias includes a first linear array of vias that contact the first conductive plate and a second linear array of vias that contact the second conductive plate.

12. The stacked capacitor of claim 1, wherein the sloped side extends from a first side of the conductive plates to an opposite second side of the conductive plates.

13. An integrated circuit having a stacked capacitor, the stacked capacitor comprising:
    a capacitor stack having:
      at least two dielectric layers,
      at least three conductive plates that include a base plate and first and second conductive plates, and
      at least one sloped side, wherein:
      the base plate has a first surface and a second opposing surface,
      the at least one sloped side of the capacitor stack has at least one slope with respect to the second surface of the base plate, and
      the at least one sloped side of the capacitor stack includes sloped sides of the at least two dielectric layers and sloped sides of the first and second conductive plates of the at least three conductive plates;
    a plurality of vias, including a first via that connects to a portion of the first conductive plate exposed at the sloped side and a second via that connects to a portion of the second conductive plate exposed at the sloped side; and
    a first electrode pad and a second electrode pad; wherein:
      the at least three conductive plates include a first group of conductive plates conductively coupled to the first electrode pad by a first subset of the plurality of vias, and a second group of conductive plates conductively coupled to the second electrode pad by a second subset of the plurality of vias.

14. The integrated circuit of claim 13, the at least one sloped side includes a slope having an angle in a range of ten degrees to eighty degrees with respect to the second surface of the base plate.

15. The integrated circuit of claim 13, wherein:
    the at least two dielectric layers includes a first dielectric layer on or over the base plate; and
    the first conductive plate is on or over the first dielectric layer.

16. A method of forming a stacked capacitor, comprising:
    forming a capacitor stack by deposition, wherein the capacitor stack includes at least two dielectric layers and at least three conductive plates including a base plate, and the base plate has a first surface and a second opposing surface;
    coating a photoresist film on or over the capacitor stack;
    patterning the photoresist film into a patterned photoresist mask having at least one sloped side with respect to the second surface of the base plate, by introducing light through a gray-scale mask, to the photoresist film;
    forming at least one sloped contact side of the capacitor stack and with respect to the second surface of the base plate by using etching and the same patterned photoresist mask; and
    forming a plurality of vias through an insulating layer overlying the capacitor stack, including a first via that connects to a portion of a first of the conductive plates exposed at the sloped side and a second via that connects to a portion of the second of the conductive plates exposed at the sloped side.

17. The method of claim 16, wherein forming the at least one sloped contact side of the capacitor stack and with respect to the second surface of the base plate by using etching and the same patterned photoresist mask includes:
applying a first etching configuration and a second etching configuration alternately.

18. The method of claim 17, wherein:
the first etching configuration is chosen according to the first and second conductive plates; and
the second etching configuration is chosen according to the at least two dielectric layers.

19. The method of claim 17, wherein:
the first etching configuration corresponds to a first etching agent for the first and second conductive plates; and
the second etching configuration corresponds to a second etching agent for the at least two dielectric layers.

20. The method of claim 16, wherein the plurality of vias includes a first linear array of vias that contact the first of the conductive plates and a second linear array of vias that contact the second of the conductive plates.

* * * * *